US006693467B2

(12) United States Patent
Marie

(10) Patent No.: US 6,693,467 B2
(45) Date of Patent: Feb. 17, 2004

(54) CIRCUIT OF SUBSTANTIALLY CONSTANT TRANSCONDUCTANCE

(75) Inventor: Herve Jean Francois Marie, Ver sur Mer (FR)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/321,200

(22) Filed: Dec. 17, 2002

(65) Prior Publication Data

US 2003/0132787 A1 Jul. 17, 2003

(30) Foreign Application Priority Data

Dec. 20, 2001 (FR) ........................................ 01 16577

(51) Int. Cl.[7] ............................................ H03F 3/45

(52) U.S. Cl. ...................... 327/103; 327/378; 327/513; 330/266

(58) Field of Search ................................ 327/103, 362, 327/378, 513; 330/261, 254, 266

(56) References Cited

U.S. PATENT DOCUMENTS 5,986,910 A 11/1999 Nakatsuka .................. 363/73
6,252,458 B1 * 6/2001 Shibata ...................... 330/261
6,259,307 B1 * 7/2001 Aram ......................... 327/513
6,323,732 B1 * 11/2001 Angell et al. ............... 330/261
6,448,848 B1 * 9/2002 Altmann .................... 327/563

FOREIGN PATENT DOCUMENTS

EP 0543056 A1 10/1991 ............ G01K/7/00

* cited by examiner

*Primary Examiner*—Dinh T. Le
(74) *Attorney, Agent, or Firm*—Aaron Waxler

(57) ABSTRACT

What is involved is a transconductance circuit is discussed, having at least one transconductance subcircuit (100) that is connected between two supply terminals (20, 21) and includes at least one MOS transistor (M1, M1'). It comprises means (200) for biasing the MOS transistor (M1, M1') in the subcircuit (100) with a biasing current whose variation as a function of temperature substantially compensates for that of the mobility of the majority carriers in the channel of the MOS transistor (M1, M1') in the subcircuit (100), in such a way as to make the transconductance of the circuit substantially independent of temperature.

9 Claims, 7 Drawing Sheets

CIRCUIT OF SUBSTANTIALLY CONSTANT TRANSCONDUCTANCE

FIELD OF THE INVENTION

The present invention relates to a MOS technology circuit of substantially constant transconductance and, in particular, to a transconductance circuit having at least one transconductance subcircuit, which subcircuit is connected between two supply terminals and includes a MOS transistor. Transconductance circuits of this kind, which are often called voltage/current converters, are widely used in analog integrated circuits and particularly in integrating circuits to produce, for example, filters, oscillators and delay circuits.

BACKGROUND OF THE INVENTION

Transconductance circuits of this kind may comprise active circuits and polysilicon or diffused resistors R and their transconductance Gm is a function of the ratio 1/R. However, the value of the resistance R varies with temperature, which makes the value of the transconductance unstable. What is more, the value of the resistance depends on the manufacturing process. The tolerance on the value of the resistance is of the order of plus/minus 15 to 20% and this is reflected in the transconductance.

Transconductance circuits produced by bipolar or MOS techniques have a transconductance Gm that is proportional to I/VT or I/2Vgt respectively, where I is the output current from the transconductance circuit and VT is the threshold voltage and Vgt the gate overdrive voltage of a MOS transistor. The transconductance Gm varies, in particular, as the current and the latter is not constant and depends on the one hand on temperature and on the other on the manufacturing process.

However, particularly in transconductance integrating circuits, efforts are made to keep the transconductance Gm substantially constant because it is on the value of the transconductance that the time constant of the circuit depends. Such integrating circuits do in fact comprise at least one transconductance circuit of transconductance Gm, and at least one integrating capacitor of capacitance C connected to the output of the transconductance circuit, and their time constant T is proportional to the ratio C/Gm. It is important for the time constant T to be as constant as possible in a large number of applications. Efforts are also made to enable the time constant to be accurately known and thus to be as insensitive as possible to the process by which the integrating circuit is manufactured.

To make the time constant substantially constant, it is necessary to subject it to feedback control. The value of the time constant is measured and, if it is different than a desired value, it is corrected. The feedback control circuit requires a reference clock signal, counters, a phase detection circuit or a phase-lock loop circuit to make the measurement and a network of resistors and capacitors to make the correction. This feedback control circuit causes a by no means negligible increase in the cost of the integrating circuit, in its energy consumption and in its size.

SUMMARY OF THE INVENTION

The present invention aims precisely to produce, in a simple way, a MOS technology transconductance circuit whose transconductance is substantially constant.

In a circuit of this type, the transconductance is seen to depend on, among other things, the mobility $\mu$ of the majority carriers (electrons or holes depending on the type of MOS transistor) in the channel of the MOS transistor and this value varies greatly with temperature. The idea that is followed to make the transconductance substantially constant is to compensate for the thermal variations in the mobility I of the majority carriers.

To achieve this, the present invention proposes a transconductance circuit having at least one transconductance subcircuit, which subcircuit is connected between two supply terminals and includes at least one MOS transistor. The circuit comprises means for biasing the MOS transistor in the subcircuit with a biasing current whose variation as a function of temperature substantially compensates for that of the mobility of the majority carriers in the channel of the MOS transistor in the subcircuit, in such a way as to make the transconductance of the circuit substantially independent of temperature.

The biasing means may comprise a current mirror connected to the MOS transistor in the subcircuit, this current mirror cooperating with a tuning circuit that is connected in turn to a reference-voltage generator, the tuning circuit comprising a MOS tuning transistor through which the biasing current that the current mirror duplicates flows, and the gate overdrive voltage of the MOS tuning transistor having a gradient with temperature that is substantially equal and opposite to that of the majority carriers in the channel of the MOS transistor in the subcircuit, said gate overdrive voltage being obtained from the reference-voltage generator.

The tuning circuit may also comprise a bipolar transistor whose emitter is connected to one of the supply terminals via a resistor, whose base is connected to the reference-voltage generator and whose collector is connected on the one hand to the other supply terminal via a series circuit having a diode and a resistor and on the other hand to the gate of the MOS tuning transistor that is connected between the other supply terminal and the current mirror.

The reference-voltage generator is intended to supply the tuning circuit with a reference voltage that enables a gradient with temperature to be obtained such that the gradient with temperature of the gate overdrive voltage of the MOS tuning transistor substantially compensates for that of the mobility of the majority carriers in the MOS transistor in the subcircuit.

Any conventional reference-voltage generator, such as, for example, a conventional generator of a reference voltage based on the forbidden energy band of a semiconductor material, may be used to produce a reference-voltage generator having the above characteristics. The voltage produced by a conventional generator of this kind has a given temperature dependence, generally of between 0 and 1. However, the temperature dependence of the gate overdrive voltage of the MOS tuning transistor may be altered in accordance with the invention to substantially compensate for that of the mobility of the majority carriers in the MOS transistor in the subcircuit.

For this purpose the conventional generator is connected to a divider bridge that includes, for example, two resistors, one of the two being connected to the output of the conventional generator and the other to ground, the center point between these two resistors being connected to the input of the tuning circuit, i.e. to the base of the tuning transistor. By altering the relative values of the resistors and hence the value of the voltage at the center point, the gradient with temperature at the emitter of the tuning transistor may be altered. Thus the combination of a conventional reference-voltage generator and a voltage divider bridge enables the gradient with temperature of the gate overdrive voltage of the MOS tuning transistor to be caused to substantially compensate for that of the mobility of the majority carriers in the MOS transistor in the subcircuit.

It is also possible for direct use to be made of a reference-voltage generator that gives a voltage enabling a desired, controlled temperature dependence to be obtained in the tuning transistor. An example of such a generator will be described.

The transconductance subcircuit may comprise a differential pair of MOS transistors whose gates form the inputs of the transconductance circuit and whose drains form its outputs.

For the purposes of linearization, the differential pair of MOS transistors may cooperate with a degeneracy resistor that is connected between the sources of the MOS transistors making up the pair.

The degeneracy resistor may be formed by a pair of MOS transistors that each have their gates connected to the gates of respective ones of the MOS transistors making up the differential pair.

The transconductance subcircuit may be connected between the two supply terminals via the biasing means on one side and a load circuit on the other.

The load circuit may be passive.

In another embodiment, the load circuit may be formed on the basis of a current source that cooperates with a system for the common mode feedback control of the outputs of the transconductance circuit.

Another object of the invention is to produce an integrating circuit from the foregoing circuit and to makes its time constant substantially independent of temperature and the manufacturing process. An integrating circuit of this kind does not need a circuit for feedback control of the time constant. An integrating circuit of this kind comprises at least one transconductance circuit as defined above, whose output is connected to an integrating capacitor produced on a MOS transistor basis.

The present invention also relates to a filter that comprises at least one such integrating circuit.

The present invention also relates to a delay circuit or an oscillator that comprises at least one such integrating circuit. The invention may thus be applied in an apparatus intended for the reception and transmission of radio telecommunications signals that includes a transconductance circuit according to the invention. An apparatus of this kind may be a telephone for example.

BRIEF DESCRIPTION OF THE DRAWINGS

These and other aspects of the invention are apparent from and will be elucidated with reference to the embodiments described hereinafter, which are purely illustrative and in no way limiting.

In the drawings.

The same items are indicated by the same reference numerals.

DESCRIPTION OF PREFERRED EMBODIMENTS

Figure 1:
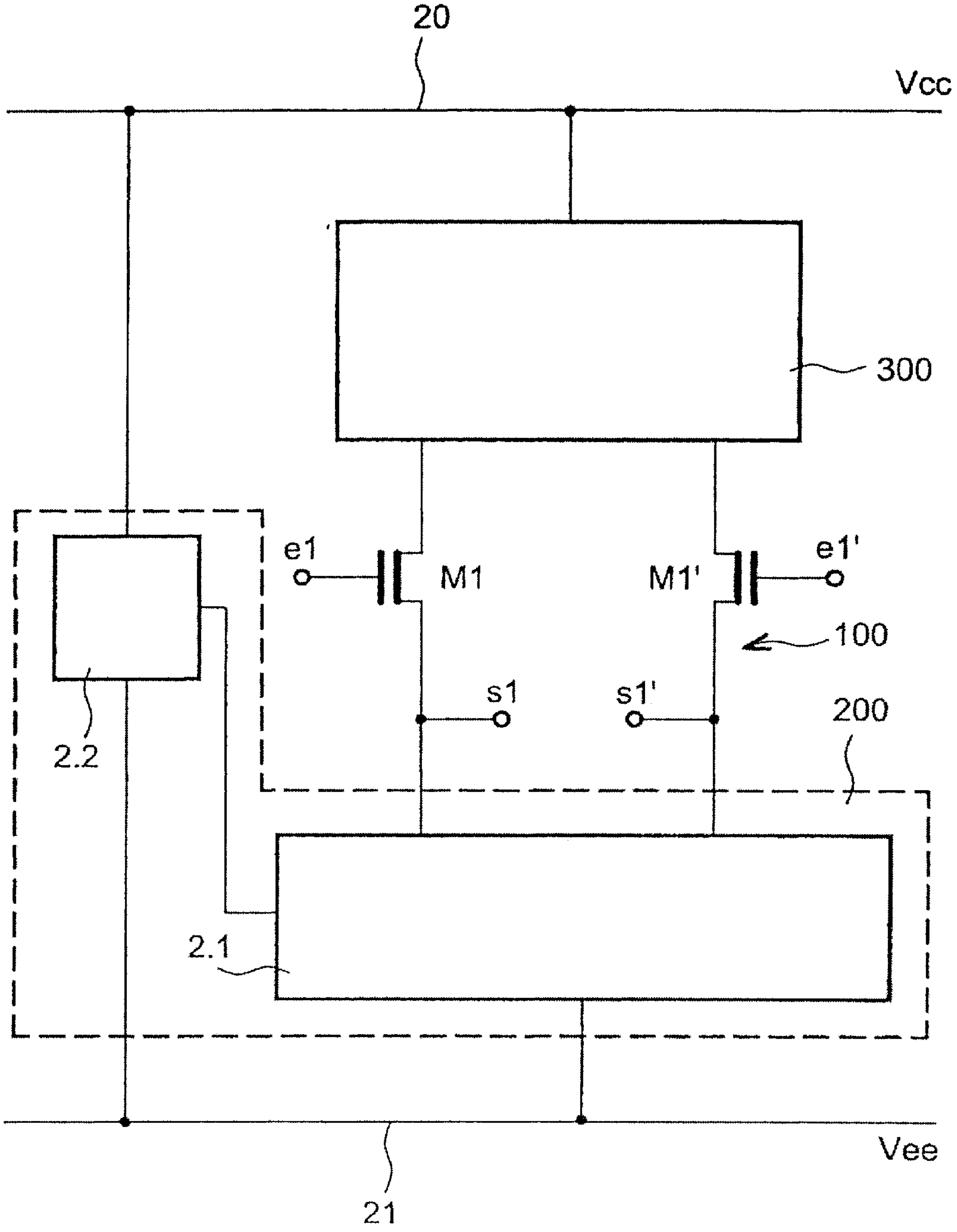
FIG. 1 shows a schematic view of a MOS technology transconductance circuit according to the invention.

An example of a MOS technology transconductance circuit according to the invention will now be considered. FIG. 1 is a highly schematic view of a MOS technology transconductance circuit according to the invention. This transconductance circuit comprises, between a first supply terminal 20 that is raised to a high potential Vcc and a second supply terminal 21 that is brought to a low potential Vee, generally ground potential, at least one transconductance subcircuit 100 having at least one MOS transistor. In the example, the transconductance subcircuit 100 is shown in the form of a differential pair of MOS transistors M1, M' and is connected to one, 21, of the supply terminals via biasing means 200 and to the other supply terminal 20 via a load circuit 300. The load circuit 300 may be passive or active as will be seen below. There are other possible configurations for the transconductance subcircuit, such as that shown in FIG. 4 for example, but the differential pair of MOS transistors is one of the simplest configurations.

According to a feature of the invention, the biasing means 200 supply the MOS transistors in the transconductance subcircuit 100 with a biasing current whose variation with temperature substantially compensates for that of the mobility of the majority carriers in the channels of the MOS transistors in subcircuit 100, in such a way that the transconductance Gm of the circuit is substantially constant and independent of temperature.

The biasing current flowing in the MOS transistors of the transconductance subcircuit 100, which are operating in the overdriven state, is of the form $Id=\frac{1}{2}(\mu C_{ox}W/L)(Vgs-V_T)^2$ where $\mu$ is the mobility of the majority carriers, $C_{ox}$ is the capacitance per unit area of the oxide layer of the MOS transistors, W/L is the ratio of the width W of the channel to its length L, Vgs is the gate-source voltage of the transistor and $V_T$ is its threshold voltage. The transconductance can be expressed as:

Gm=dId/dVgs in the overdriven state or $Gm=(\mu C_{ox}W/L)(Vgs-V_T)$, with the difference $Vgs-V_T$ corresponding to Vgt, i.e. the gate overdrive voltage of the MOS transistors M1 and M1'.

In this expression, the value of the mobility A1 of the majority carriers varies greatly with temperature, whereas it is substantially independent of the manufacturing process. By compensating for this variation by means of the gate overdrive voltage Vgt, it is possible to make the transconductance substantially independent of temperature.

The geometrical dimensions of the channel of the MOS transistors are fully under control at the time of manufacture. The value of the capacitance Cox of the thickness of oxide on the other hand depends on the manufacturing process and may vary for transconductance circuits belonging to different batches.

It will now be seen how the biasing means 200 may be produced. They may be formed by a current mirror 2.1 that cooperates with a tuning circuit 2.2, that is connected in turn to a reference-voltage generator 2.3, the tuning circuit 2.2 comprising a MOS tuning transistor M7 that carries the biasing current that the current mirror duplicates and whose gate overdrive voltage has a gradient with temperature that is substantially equal and opposite to that of the mobility of the majority carriers in the channel of the MOS transistors of the transconductance subcircuit 100, said gate overdrive voltage being obtained from the reference-voltage generator.

Figure 2:
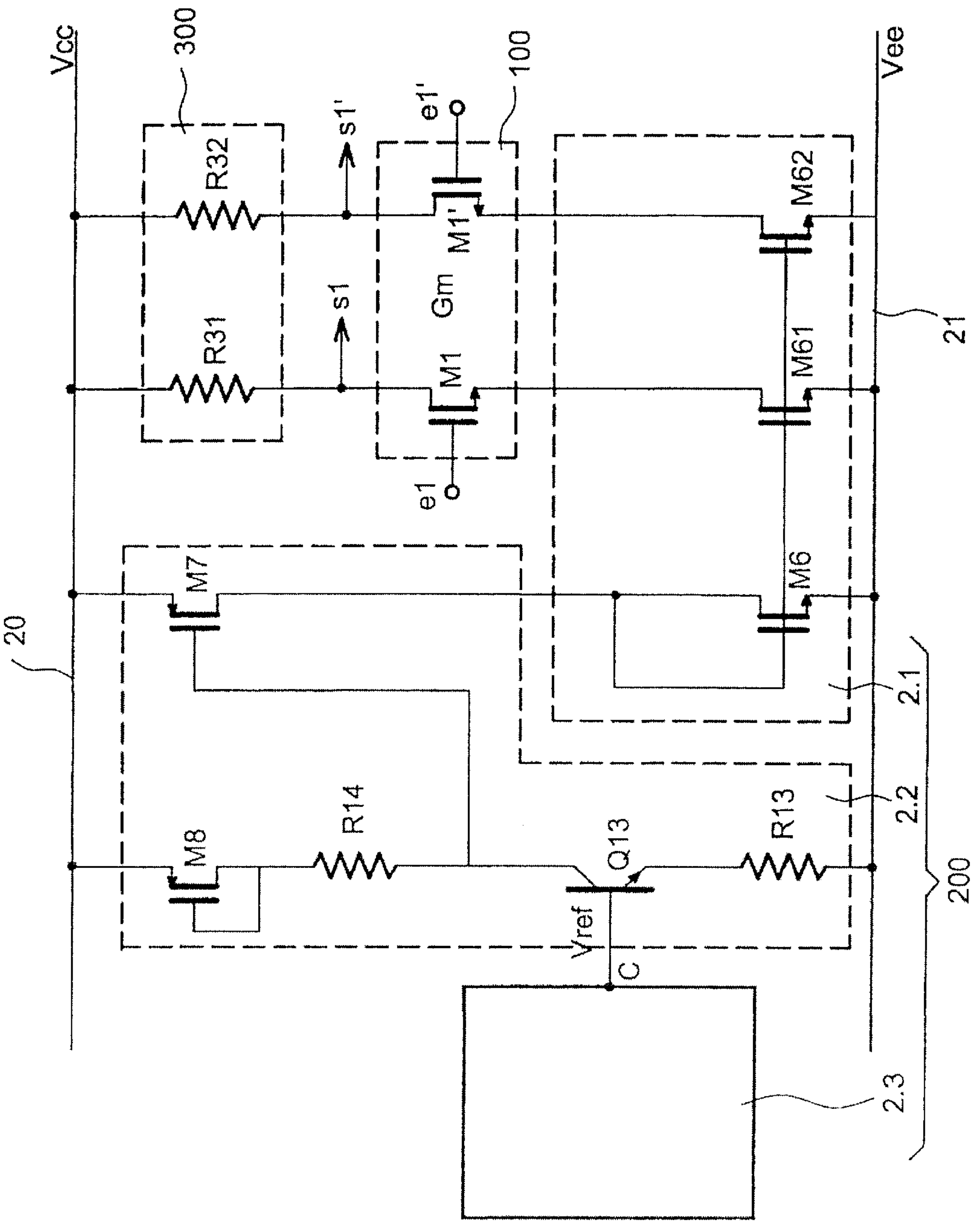
FIG. 2 shows a diagram of a MOS technology transconductance circuit according to the invention having a passive load circuit, in which the biasing means are shown in detail.
Figure 3A:
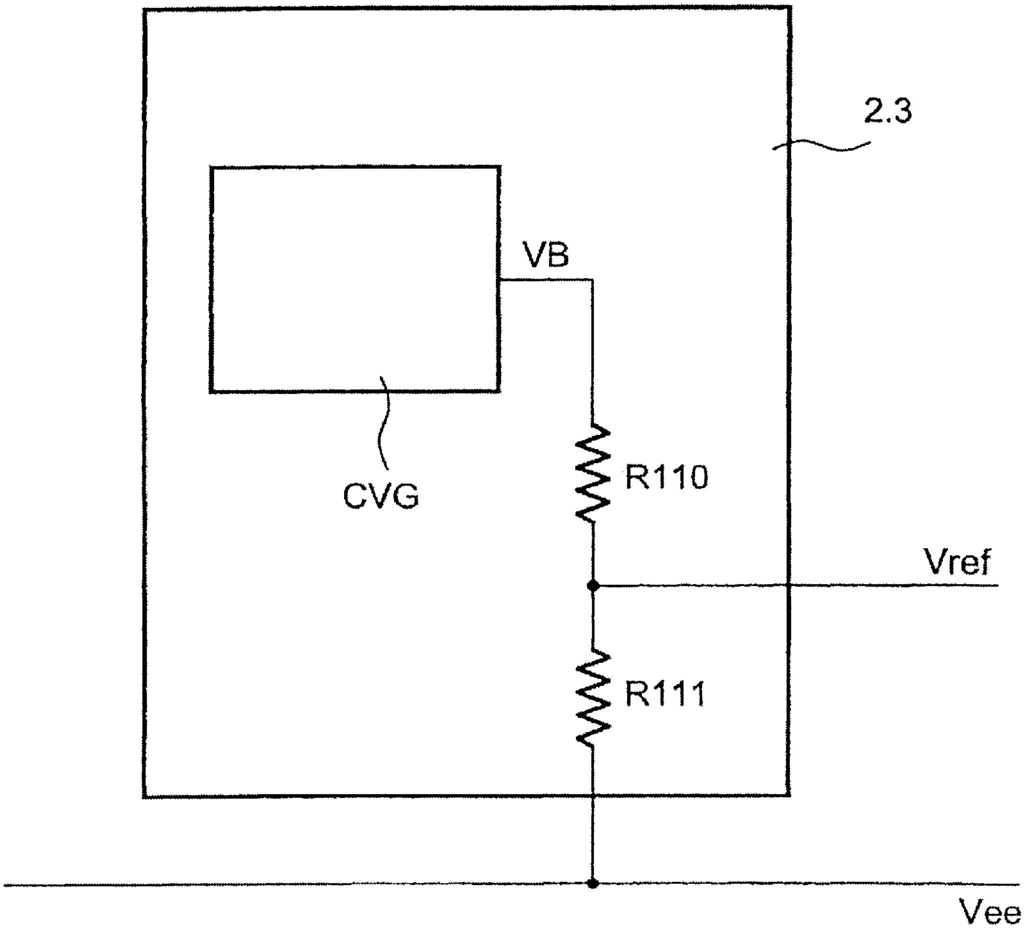
FIG. 3 shows an example of the reference-voltage generator included in the biasing means.
Figure 3B:
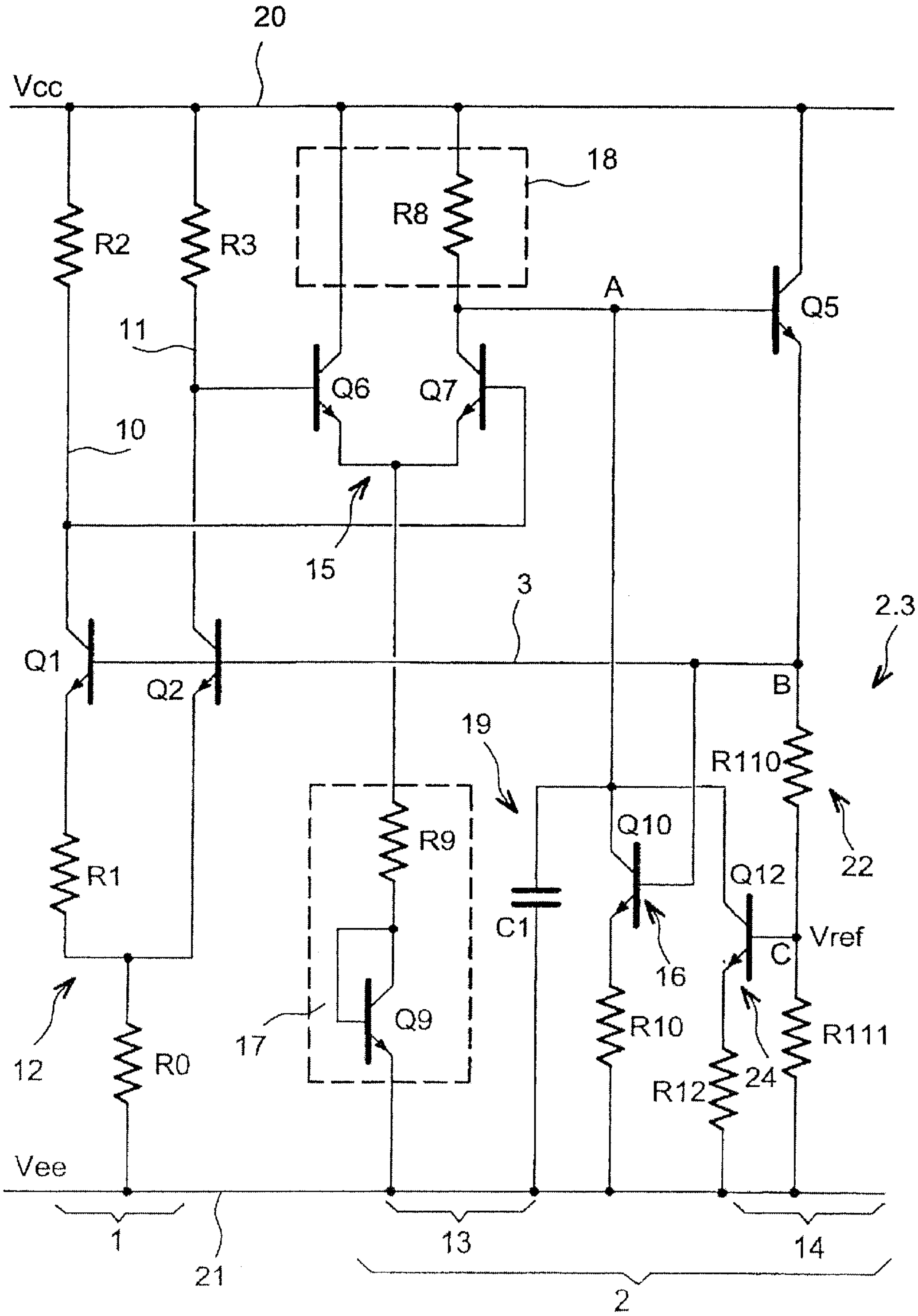

Reference may now be made to FIG. 2 that shows the current mirror 2.1 and the tuning circuit 2.2 in detail. Two embodiments of the reference-voltage generator 2.3 are shown in FIGS. 3A and 3B. The generator shown in FIG. 3B is described in detail in the French patent application No. 0116573 filed on Dec. 20, 2001 in the name of the present applicant.

It will be seen that, in FIG. 2, the load circuit 300 is passive and is formed by resistors R31, R32 that are connected between one, 20, of the supply terminals and the drains of transistors M1' and M1' respectively of the differential pair 100. In the example, the transistors M1, M1' forming the differential pair 100 are n-channel MOS transistors but they could be p-channel transistors subject to the appropriate reversals.

The sources of the transistors M1, M1' forming the differential pair 100 are connected to the biasing means 200. The gates of the transistors M1, M1' forming the differential pair form the inputs e1, e1' of the transconductance circuit whereas the outputs s1, s1' are taken from the drains of the transistors M1, M1' forming the differential pair 100, which are connected to the load circuit 300.

The current mirror 2.1 comprises a feedback-controlled MOS transistor M61, M62 connected to each of the MOS transistors M1, M' forming the differential pair of transistors 100, and a master MOS transistor M6 that is connected to the MOS tuning transistor M7 of the tuning circuit 2.2.

The tuning circuit 2.2 will now be considered in more detail. It comprises a bipolar transistor Q13 whose emitter is connected to one, 21, of the supply terminals via a resistor R13, whose base is connected to the reference-voltage generator 2.3 and whose collector is connected on the one hand to the gate of the MOS tuning transistor M7 and on the other hand to the other supply terminal 20 via a series circuit formed by a resistor R14 and a diode, which latter represented by a MOS transistor M8 connected as a diode, i.e. whose gate is connected to its drain. To be more exact, the source of the MOS transistor M8 is connected to the other supply terminal 20, its drain being connected to the resistor R14 and to its gate.

The reference-voltage generator 2.3 applies to the base of the bipolar transistor Q13 a voltage Vref whose variation with temperature is selected in such a way that the gate overdrive voltage Vgt of the MOS tuning transistor M7 connected to the current mirror 2.1 has the appropriate gradient with temperature to counterbalance that of the mobility of the majority carriers in the channel of the MOS transistors M1, M1' of the transconductance subcircuit 100. Due to their manufacture, the operating point of all the transistors is in the high inversion region, i.e. the gate overdrive voltage is equal to Vgt<VDS.

It will now be seen how the gate overdrive voltage Vgt of the MOS tuning transistor M7 connected to the current mirror 2.1 may be expressed.

Vgt(M7)=Vgs(M7)−$V_T$ where Vgs(M7) is the gate-source voltage of the MOS tuning transistor M7 and $V_T$ is the threshold voltage of the MOS tuning transistor M7.

Or again, Vgt(M7) may be expressed as follows:

Vgs(M7) V(R14)+Vgs(M8) where V(R14) is the voltage at the terminals of resistor R14 and Vgs(M8) is the gate-source voltage of the MOS transistor M8 that is connected as a diode.

However, Vgs(M8)=VT because the gate overdrive voltage of the MOS transistor M8 is very small. It is therefore possible to simplify and to equate the gate overdrive voltage Vgt(M7) of the MOS tuning transistor M7 with the voltage V(R14) at the terminals of resistor R14:

Vgt(M7)=V(R14).

By adjusting the value and the gradient with temperature of the voltage Vref supplied by the reference-voltage generator 2.3 and the values of the resistors R13 and R14, it is easy to obtain for voltage Vgt(M7) the desired value and gradient to make the transconductance of the transconductance circuit substantially independent of temperature.

There will now be described a very simple and uniform manner of comparing the gradients with temperature of the various electronic components that are of interest in the present case. A number of units are often employed to designate gradients with temperature: where resistors are involved it is expressed in ppm/° C., whereas for the base-emitter voltage Vbe of a bipolar transistor it is approximately −2 mV/° C. and for the mobility of majority carriers it varies as $T^{-}1.5$.

Let us assume a dimensionless magnitude t such that:

$t=(T-T_O)/T_O$, where T is the temperature considered and To is a reference temperature equal to, for example, 25° C. The following values for t are obtained for the usual temperatures T:

| | | |
|---|---|---|
| t = −1 | for | T = −273° C. or 0° K. |
| t = −¼ | for | T = −50° C. |
| t = 0 | for | T = 25° C. |
| T = +¼ | for | T = 100° C. |

A voltage can be expressed as follows as a function of the magnitude t:

$V=V_O(a+bt+ct^2)$ where $V_O$ is the value of the voltage at the reference temperature $T_O$ and a, b and c are coefficients. The first order gradient with temperature is given by:

α1=b/a and the second order gradient with temperature is given by α2=c/a.

For a voltage proportional to absolute temperature (known as a PTAT voltage), it is possible to write:

$V_{PTAT}=VP_{TATO}(1+t)$ and for a base-emitter voltage of a bipolar transistor:

$V_{BE}=V_{BEO}(1-t/2)$ where VPTATO and VBEO are voltages at the reference temperature. For a bipolar transistor, $V_{BEO}$=0.8 V.

From this it can be deduced that the gradient with temperature of a circuit whose voltage is proportional to absolute temperature is 1, whereas the gradient with temperature of the base-emitter voltage of a bipolar transistor is −0.5.

As for resistances, their gradients may, with this notation, vary negatively or positively depending on their value and may assume a value of 0. The mobility $\mu$ of the majority carriers has a gradient of −1.5.

In the majority of cases the term β2 may be considered negligible, except in the case of the current gain f of bipolar transistors.

Given the foregoing, efforts are made to make the gradient of the gate overdrive voltage Vgt(M7) of the MOS tuning transistor M7 substantially equal to +1.5 to compensate for that of the mobility $\mu$ of the mobility carriers, which is −1.5.

A description will now be given by reference to FIG. 3 of two examples of reference-voltage generator 2.3 that, on the basis of the bipolar transistor Q13 of the tuning circuit 2.2, will give a reference voltage Vref whose gradient with temperature is adjusted to produce the desired gradient with temperature for the gate overdrive voltage Vgt(M7) of the MOS tuning transistor M7.

The generator 2.3 of reference voltage Vref in FIG. 3A is made up of a conventional reference-voltage generator CVG that supplies a voltage VB whose temperature dependence may be of any kind whatever. This dependence is often zero but it may be altered in accordance with the invention. What is more, the conventional generator CVG advantageously puts out a reference voltage that is based on the forbidden energy band of a semiconductor material. A divider bridge that comprises, for example, two resistors R110 and R111 is connected to the output of the reference generator CVG. One, R110, of the two resistors has one of its terminals connected to the output of the conventional generator CVG that puts out the voltage VB and the other resistor has one of its terminals connected to a low potential Vee, generally ground. The two resistors R110 and R111 have a common point at the point where the output of the reference-voltage generator 2.3 takes place. By altering the relative values of the resistors, the output voltage Vref from the generator 2.3 produced by this combination of a conventional generator CVG and a divider bridge R110, R111 may be selected in such a way that the gradient with temperature in the tuning transistor compensates for that of the mobility $\mu$ of the majority carriers, which is −1.5. When the gradient with temperature of the voltage VB is zero, R110=R111/8 does in fact allow a gradient with temperature of 1.5 to be obtained which, as will be seen, is particularly advantageous.

FIG. 3B shows a detailed example of an improved reference-voltage generator that allows a voltage to be obtained whose dependence on temperature is controlled. The generator 2.3 of reference voltage Vref in FIG. 3B is made up of an input stage 1 having two lines 10, 11 that are connected between the two supply terminals 20, 21. Situated in each of the lines 10, 11 is at least one bipolar transistor Q1, Q2 and the size of the emitters of these transistors is not the same. The input circuit 1 combines a base-emitter voltage of one, Q2, of the bipolar transistors with a voltage proportional to absolute temperature. To be more exact, the two transistors Q1, Q2 have their bases commoned and their collectors connected to the supply terminal 20, which is raised to the potential Vcc, via resistors R2, R3 respectively. The emitter of the first transistor Q1 is connected to the other supply terminal 21 via a series circuit 12 comprising two resistors R1, R0. The emitter of the second transistor Q2 is connected to the other supply terminal via one, R0, of the resistors in the series circuit 12. It is assumed that the emitter area of the first transistor Q1 is equal to n (n being a whole number greater than 1) times that of the second transistor Q2. n may for example be equal to 8.

This input stage 1 cooperates with an operational amplifier 2 that comprises a differential amplifier stage 13, an output stage 14, and a compensating circuit 16.

The output stage 14 puts out the reference voltage Vref and is connected by a loop 3 to the input stage 1 at the common bases of the two transistors Q1, Q2 of the input stage 1.

The differential amplifier stage 13 comprises a differential pair 15 of transistors Q6, Q7 that are connected to the input stage 1 and are connected between the two input terminals 20, 21 via a source circuit 17 and a load circuit 18. To be more exact, the bases of the two transistors Q6, Q7 form the two differential inputs of stage 13. The base of transistor Q6 is connected to the line 11 in common with the collector of transistor Q2 and the base of transistor Q7 is connected to the line 10 in common with the collector of transistor Q1. The emitters of transistors Q6, Q7 are connected together. They are connected to the supply terminal 21, which is brought to the potential Vee by the source circuit 17, which is an active circuit. The source circuit 17 and load circuit 18 comprise regulating means R8, R9 to regulate the reference voltage Vref even when the loop 3 is open, the reference voltage being adjusted in a manner substantially independent of the manufacturing process and of the variations in the supply voltage Vcc−Vee and with a predetermined gradient with temperature.

The source circuit 17 comprises a series arrangement of a diode, represented by a transistor Q9 connected as a diode, and a resistor R9 that forms part of the regulating means. The resistor R9 is connected to the common emitters of the transistors Q6, Q7 forming the differential pair 15. The collectors of the two transistors Q6, Q7 are each connected to the supply terminal 20, which is raised to the potential Vcc, via the load circuit 18. This load circuit 18 comprises a resistor R8, which forms part of the regulating means and is connected between the collector of the transistor Q7 of the differential pair and the supply terminal 20. The collector of the other transistor Q6 of the differential pair 15 is connected directly to the supply terminal 20. The output stage 14 is connected at a first node A to the load circuit 18 and to the collector of the transistor Q7. Due to their configuration, the regulating means in the source circuit 17 and load circuit 18 make the voltage that arises at the first node A virtually independent of the supply voltage Vcc−Vee.

The ratio of the resistors R9 and R8 that form the regulating means is in fact selected in such a way that a variation δ(Vcc−Vee) in the supply voltage produces substantially the same variation δ(Vcc−Vee) in the source circuit 17, and in the load circuit 18 at the terminals of the load resistor R8, and does so whatever the temperature. Consequently, the voltage at the first node A does not vary when there is a variation in the supply voltage. The ratio of the resistors R8/R9 forming the regulating means is selected in such a way that the common mode gain of the resistors R2, R3 is adjusted to a value of −1. This is achieved when the ratio of the values of the resistors R8/R9 is approximately 2, the current in resistor R9 being substantially twice that flowing in load resistor R8. What is more, the source circuit 17 is configured to generate a current that is substantially independent of temperature, which amounts to saying that the value of resistor R9 is adjusted to make the voltage at its terminals substantially independent of temperature. This condition is satisfied for all temperatures if the following adjustment is made at input stage 1.

The voltage VR9 at the terminals of resistor R9 is given by:

$$V_{R9}=(V_{cc}-V_{ee})-(V_{R3}+V_{BE}(Q6)+V_{BE}(Q9))$$

$$V_{R9}=(V_{cc}-V_{ee})-(V_{R3}-2V_{BE})$$

The term $(V_{R3}+2V_{BE})$ must then be substantially independent of temperature and this is the case if it is equal to twice the voltage present at, for example, the connection between the loop 3 and the output stage 14, and if the gradient with temperature of the top resistor R3 compensates for those of the two base-emitter voltages of the transistors Q6 and Q9. This enables the reference-voltage generator to be made substantially insensitive to the manufacturing process. With the notation given above, the gradient with temperature of resistor R3 is substantially equal to one and that of the voltage at the terminals of resistor R9 is substantially equal to zero. The two collector resistors R2, R3 in the input stage 1 are identical.

The output stage 14 comprises a follower circuit 22 having a transistor Q5 whose emitter is connected to the supply terminal 21 via a bridge formed by resistors R110, R111. The base of transistor Q5 is connected to the first node A, whereas the emitter of transistor Q5 is connected to the loop 3 where it is closed at a second node B. The resistor R110 is connected to the emitter of transistor Q5 and the resistor R111 is connected to the supply terminal 21. The two resistors R110 and R111 have a common point C at which the output of the reference-voltage generator 2.3 takes place. Use is again made here of a divider bridge, but of a more elaborate form in this case.

The output stage 14 also comprises an adjusting circuit 24 that generates a current whose gradient with temperature is substantially equal to +1.5 and this gradient is adjusted by the values of the resistors R110, R111 in the divider bridge and, more particularly, by the ratio (R110+R111)/R111. By giving this ratio a value of substantially 8/9, the current flowing in resistor R12 has a gradient of substantially +1.5. The adjusting circuit 24 comprises a transistor Q12 whose emitter is connected to the supply terminal 21 via a resistor R12, whose collector is connected to the first node A and to the collector of the compensating circuit 16 and whose base is connected to the follower circuit 22. The base of transistor Q12 is connected to the common point C and it is from the base of transistor Q12 that the output of the reference-voltage generator takes place.

The current that flows in the adjusting circuit 24 will be duplicated in the Q13, R13 combination in the tuning circuit 2.2 shown in FIG. 2. This combination Q13, R13 does in fact form a current mirror with the adjusting circuit 24. Resistors R13 and R12 are identical.

With an adjusting circuit 24 of this kind, the gradient with temperature at the common point C that corresponds to the output point of the reference-voltage generator 2.3 must be substantially equal to zero. To achieve this, it will now be seen how the compensating circuit 16 and the adjusting circuit 24 act on the gradient with temperature at the first node A.

The gradient with temperature of the voltage at the first node A must be substantially equal and opposite to that applied by the transistor Q5 in the output stage 14 to obtain gradient compensation at the common point C. As a result, the gradient with temperature of the voltage at the first node A must be substantially equal to 0.5 because the gradient with temperature of a base-emitter voltage of a bipolar transistor is −0.5. This gradient is governed by that of the source circuit 17 and that of the compensating circuit 16 that is associated with the adjusting circuit 24. These three circuits each comprise a bipolar transistor, Q9, Q10 or Q12, whose gradient with temperature is imposed and is substantially equal to −0.5, and a resistor, R9, R10 or R12, whose resistance it is merely necessary to adjust to fix that of the load circuit 18. The gradient with temperature of the compensating circuit 16 that cooperates with the adjusting circuit 24 thus takes on a value that is slightly higher than one in the example described and that of the source circuit 17 a value that is substantially equal to zero.

The currents generated by the compensating circuit 16 and the adjusting circuit 24 combine at the load circuit 18 and the resulting current in the load circuit has a gradient with temperature that depends on the relative sizes of the currents in the two circuits, i.e. on the values of resistors R10 and R12. In the example described, it is preferable for the gradient due to the compensating circuit 16 and the adjusting circuit 24 to be slightly greater than one to overcome the inevitable second order parasitics whose effect is to reduce the value of the gradient.

It is preferable for a circuit 19 for stabilizing the differential amplifier 13 to be provided in the operational amplifier 2. This circuit may take the form of a capacitor C1 connected between the node A and the supply terminal 21 The table below gives the value, gradient and voltage characteristics that are assigned to each of the components of the generator for generating the reference voltage Vref that is shown in FIG. 3.

| NAME | VALUE | GRADIENT | VOLTAGE DROP |
|---|---|---|---|
| Vcc-Vee | 2.8 | 0 | — |
| R2, R3 | 16.8 kΩ | 1 | 0.8 V |
| Vbe (Q1, Q2, Q6, Q7, Q5, Q9, Q10, Q12, Q13) | | −0.5 | 0.8 V |
| R1 | 1 kΩ | 1 | 0.05 V |
| R0 | 4.2 Ω | 1 | 0.4 V |
| R8 | 10 kΩ | 0.5 | 0.8 V |
| R9 | 4.1 kΩ | 0 | 0.4 V |
| R10 | 40 kΩ | 1 | 0.4 V |
| R12, R13 | 15 kΩ | 1.5 | 0.27 V |
| R110 | 1 kΩ | — | — |
| R111 | 8 kΩ | — | — |

All the bipolar transistors have been shown as NPN transistors, but it is possible for them to be replaced by PNP bipolar transistors by making all the appropriate reversals, particularly at the load and source circuits.

Figure 4:
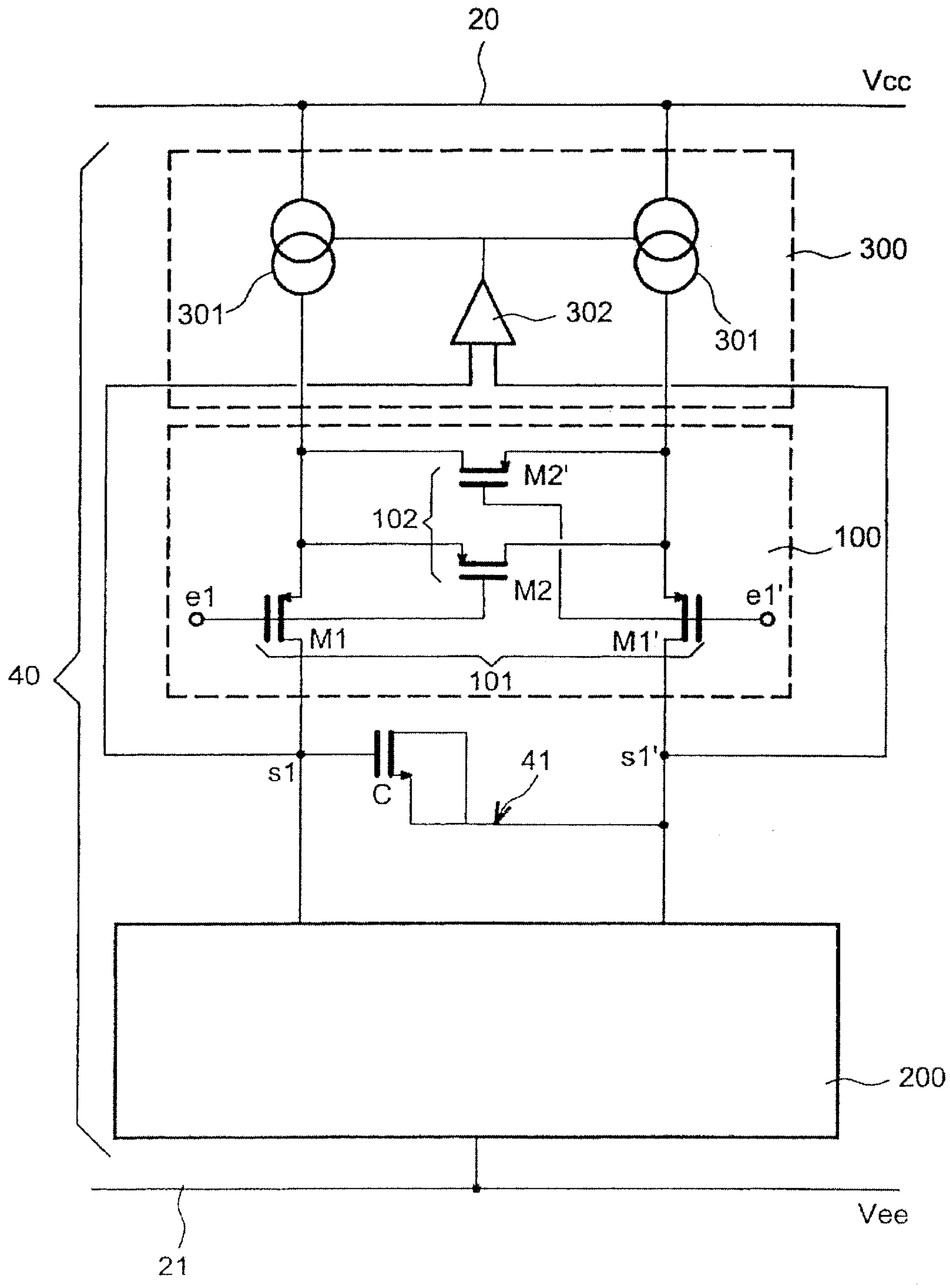
FIG. 4 shows an integrating circuit according to the invention produced from a transconductance circuit having an active load circuit.

FIG. 4 shows an example of an integrating circuit produced from a transconductance circuit according to the invention. This integrating circuit comprises a circuit 40 of substantially constant transconductance and an integrating capacitor 41 connected at the output of the transconductance circuit. By producing the capacitor 41 on a MOS transistor basis, the time constant T of the integrating circuit becomes independent of temperature and of the process for manufacturing the circuit. In the example, the gate of the MOS transistor forming the capacitor C is connected to the output s1 and the drain, channel and source of the MOS transistor to the output s1'.

In this example, the transconductance circuit 40 still has a transconductance subcircuit 100 connected between a biasing circuit 200 and a load circuit 300. The transconductance circuit 40 is not, however, of the same type as that shown in FIG. 2.

The transconductance subcircuit 100 still comprises a differential pair 101 of MOS transistors M1, M1'. This differential transistor pair 101 now cooperates with a degeneracy resistor 102 that takes the form in this example of a pair of MOS degeneracy transistors M2, M2', with the MOS transistors in the differential pair Ml, M1' each being associated with respective ones of the MOS degeneracy transistors M2, M2'. A degeneracy resistor 102 of this kind produced with MOS transistors gives better linearity than a degeneracy resistor of polycrystalline silicon. The optimum linearity is obtained when the ratio W1/L1 of the width of the channel of the MOS transistors forming the differential pair 101 to its length is substantially equal to seven times the ratio W2/L2 of the width of the channel of the MOS transistors forming the degeneracy resistor 102 to its length.

To be more exact, the two MOS transistors M1, M1' forming the differential pair 101 have their gates forming the inputs e1, e1' of the integrating circuit. Their sources are connected to the supply terminal 20, which is raised to potential Vcc, via the load circuit 300 and their drains connected to the supply terminal 21, which is at the potential Vee, via the biasing circuit 200. The biasing circuit 200 is assumed to be similar to that shown in FIGS. 2 and 3.

The output s1, s1' of the transconductance circuit 40 takes place from the drains of the MOS transistors M1, M1' forming the differential pair 101. The integrating capacitor C is connected between the two outputs s1, s1' of the transconductance circuit.

The MOS transistors M1, M1' forming the differential pair 101 are connected to the MOS transistors M2, M2' forming the degeneracy resistor 102 as follows: the sources of the MOS transistors M1, M1' are each connected on the one hand to the source of one of the MOS degeneracy transistors M2 and respectively M2' and on the other to the drain of whichever is the other MOS degeneracy transistor M2 and respectively M2'. The gate of each of the MOS degeneracy transistors M2, M2' is connected to the gate of that MOS transistor M1, M1' in the differential pair 101 with which it is associated.

The load circuit 300 is now shown as an active circuit in the form of two current sources 301, which are provided with a system 302 for the common mode feedback control of the outputs s1, s1' of the transconductance circuit 40 in such a way as to stabilize the common mode output voltage. The voltages present at the outputs s1, s1' are compared in a comparator 302 and the currents from current sources 301 are adjusted as a function of the result of the comparison. The load circuit may equally be a simple load circuit of the kind known to the person skilled in the art that simply comprises resistors. The common mode feedback control system is an improved embodiment.

The transconductance Gm of the transconductance circuit 40 in FIG. 4 will now be given.

The MOS transistors M1, M1' forming the differential pair 101 operate in the overdriven mode and the current I1 flowing in them is given by:

$I1=\frac{1}{2}(\mu C_{OX}W1/L1)Vgt^2$ where $\mu$ is the mobility of the majority carriers in the channel of the MOS transistors M1, M1', $C_{OX}$ is the capacitance per unit area of the oxide layer of the MOS transistors, W1/L1 is the ratio of the width W1 of the channel of the MOS transistors to its length L1, and Vgt is the gate overdrive voltage of the MOS transistors. The transconductance gm1 of the differential pair is given by:

$$gm1=\beta1 Vgt \quad \text{where } \beta1=\mu C_{ox}W1/L1$$

The MOS transistors M2, M2' forming the degeneracy resistor 102 operate in a linear mode. They are of the same type as the MOS transistors M1, M1' forming the differential pair and thus have the same mobility $\mu$ for the majority carriers and the same gate overdrive voltage Vgt as the MOS transistors M1, M1' forming the differential pair 101. The current I2 flowing in them is given by:

$I2=(\mu C_{OX}W2/L2)Vgt.Vds$ where $\mu$ is the mobility of the majority carriers in the channel of the MOS transistors M2, M2', $C_{OX}$ is the capacitance per unit area of the oxide layer of the MOS transistors, W2/L2 is the ratio of the width W2 of the channel of the MOS transistors to its length L2, Vgt is the gate overdrive voltage of the MOS transistors and Vds is the drain-source voltage of the MOS transistors.

The resistance R of the MOS transistors forming the degeneracy resistor 102 is given by R=1/ρ2. Vgt where $$\beta2=\mu C^{OX}W2/L2$$

The transconductance Gm of the transconductance circuit 40 is given by:

$$Gm=\frac{gm1}{1+gm1\frac{R}{4}}$$

$$Gm=\frac{1}{1+\frac{7}{4}}\cdot\beta1\cdot Vgt$$

$$Gm=\beta1\cdot Vgt/2.75$$

$$Gm=\frac{\sqrt{2\beta1\cdot I1}}{2.75}$$

The time constant T of the integrating circuit is given by: T=Gm/C where C is the capacitance of capacitor C.

$$T=\frac{\frac{1}{2.75}\mu C_{OX}\cdot\frac{W1}{L1}\cdot Vgt}{C_{OX}W_CL_C}$$

The product $W_CL_C$ is the product of the width $W_C$ of the channel of the MOS transistors forming capacitor C multiplied by its length $L_C$.

$$T=\frac{1}{2.75}\cdot\frac{W1}{L1\cdot W_C\cdot L_C}\cdot\mu\cdot Vgt$$

By producing the capacitor C on a MOS transistor basis, such as by using a MOS transistor operating in a linear mode whose gate forms one of the electrodes of the capacitor and whose source, drain and channel form the other electrode, the time constant T no longer depends on the manufacturing process because the capacitance $C_{OX}$ is no longer present in the expression for the time constant.

$$T=F.\mu.Vgt$$

The time constant now depends only on a geometrical factor F that is a function of W1/L1 and $W_CL_C$ of the MOS transistors, on the mobility $\mu$ of the majority carriers and on Vgt. By adjusting the gradient of voltage Vgt to compensate for that of the mobility $\mu$, the time constant T of an integrating circuit of this kind is made virtually insensitive to temperature and to the manufacturing process.

An integrating circuit of this kind is able to operate with higher input signal amplitudes than a prior art integrating circuit having a transconductance subcircuit having only a differential pair of MOS transistors.

Figure 5:
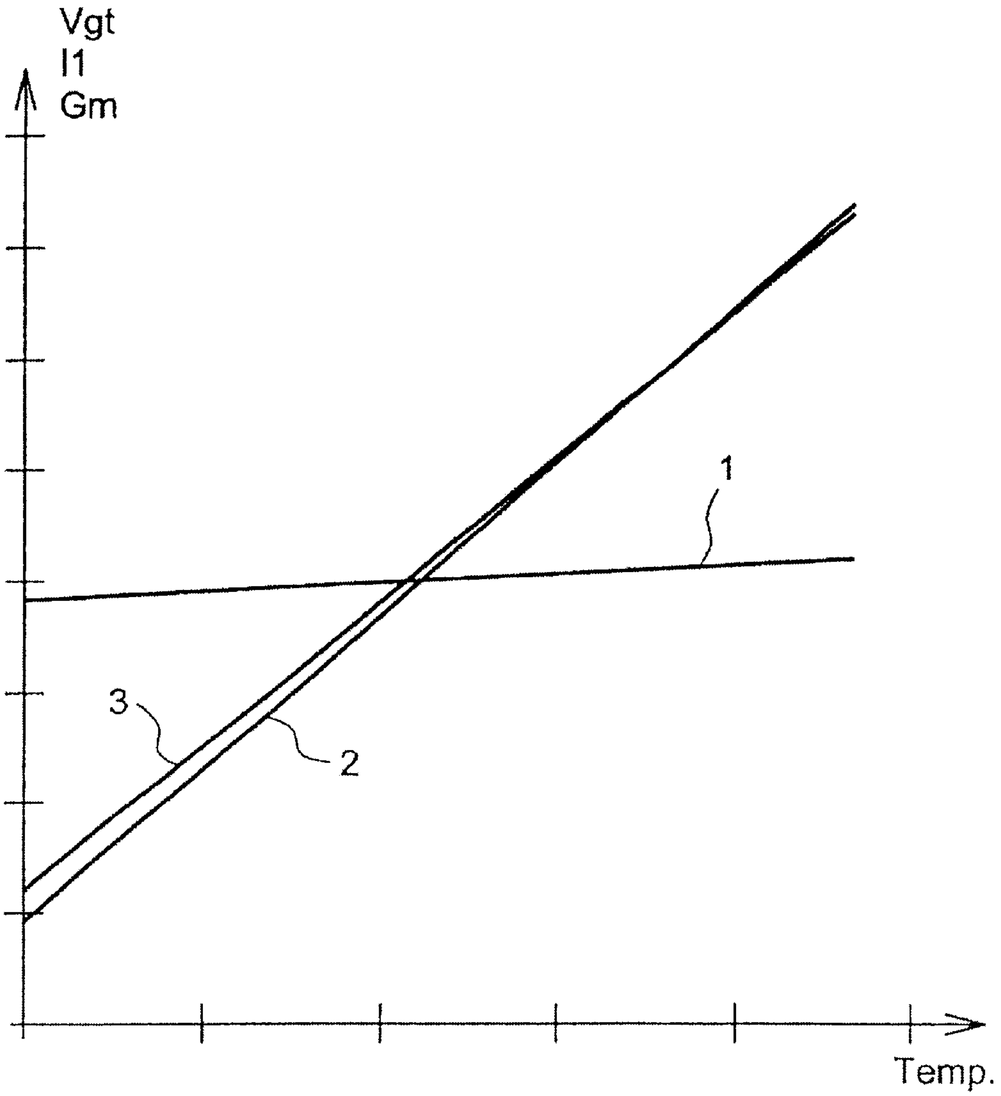
FIG. 5 shows the variation as a function of temperature in gate overdrive voltage, biasing current and transconductance in the integrating circuit in FIG. 4.

FIG. 5 shows the variations of different parameters as a function of temperature in an integrating circuit such as that shown in FIG. 4. The curve marked I represents the variations in the transconductance Gm of the transconductance circuit 40, the curve marked 2 represents the current I1 and curve 3 represents the gate overdrive voltage Vgt of the MOS transistors in the transconductance subcircuit. It is perfectly clear that the transconductance Gm is substantially independent of temperature and that I1 and Vgt have substantially the same gradient with temperature of a value of +1.5.

An integrating circuit of this kind has far better accuracy than prior art circuits.

Since the biasing current for the MOS transistors in the transconductance subcircuit depends on how well adapted critical resistors or the transistors in the reference-voltage generator and the current mirror are, the size of these components needs to be carefully adapted to allow the desired accuracy to be obtained.

From a statistical analysis, the time constant obtained with the integrating circuit shown in FIG. 4 has an accuracy of approximately 3% due to the variations with temperature in the supply voltage and of approximately 1.3% due to the scatter between components and of approximately 1.6% due to the manufacturing process.

This corresponds to a frequency shift of approximately ±12%

Figure 6A:
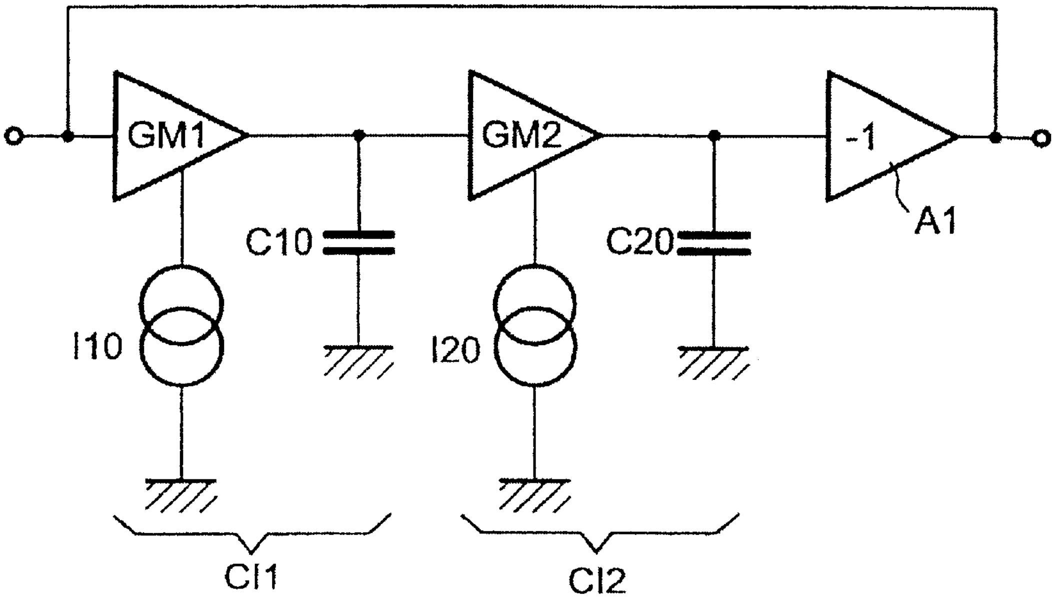
FIGS. 6A and 6B show diagrams of an oscillator and a delay circuit produced from an integrating circuit according to the invention.
Figure 6B:
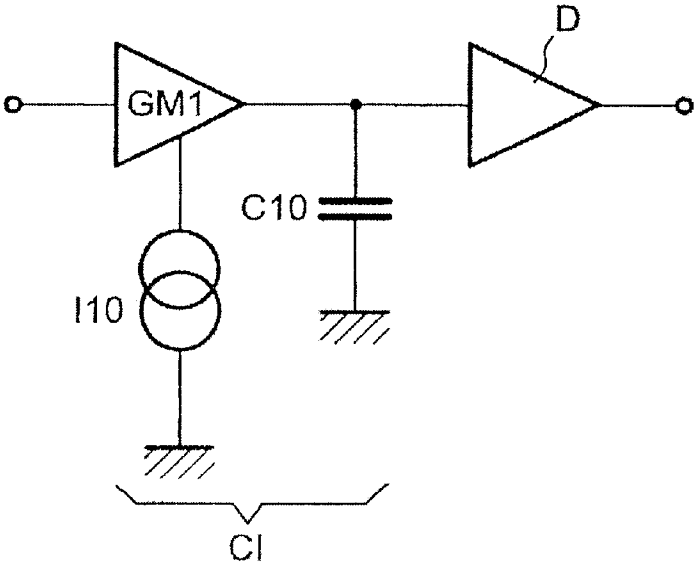

An integrating circuit of this kind may be used as a filter. It may be used as a basic building block in an oscillator circuit, as shown in FIG. 6A or in a delay circuit as shown in FIG. 6B. In FIG. 6A can be seen two integrating circuits according to the invention CI1, CI2 that are connected in series, the output of the second integrating circuit CI2 being connected to an amplifier A1 having a gain of −1. The output of amplifier Al is looped back to the input of the first integrating circuit CI1. Each of the integrating circuits is shown diagrammatically as a transconductance amplifier GM1, GM2 biased by a current source 110, 120. The output of amplifiers GM1, GM2 is connected to first electrodes of integrating capacitors C10, C20 whose other electrodes are taken to ground. Better accuracy for the frequency of oscillation is obtained by using the integrating circuits of the invention.

In FIG. 6B, the delay circuit comprises an integrating circuit CI according to the invention whose output is connected to a delay stage D. The output of the delay circuit takes places at the output of the delay stage D whereas input to the delay circuit takes place at the input of the integrating circuit CI. The integrating circuit CI is shown diagrammatically as in FIG. 6A as a transconductance amplifier GM1 having biasing means I10 and an integrating capacitor C10.

Better accuracy for the propagation time in the delay circuit is obtained by using an integrating circuit according to the invention.

The circuits shown in these latter Figures may advantageously be used in an apparatus intended for the reception and/or transmission of radio telecommunications signals that includes a transconductance circuit of improved performance according to the invention. The insertion of such transconductance circuits in such pieces of apparatus is known to the person skilled in the art.

Although certain embodiments of the present invention have been shown and described in detail, it will be appreciated that various changes and modifications may be made without thereby exceeding the scope of the invention.

What is claimed is:

1. A transconductance circuit comprising:

at least one transconductance subcircuit connected between two supply terminals and comprising at least one MOS transistor comprising a channel;

means for biasing the MOS transistor in the subcircuit with a biasing current having a variation as a function of temperature that substantially compensates mobility of majority carriers in the channel of the MOS transistor in the subcircuit, so as to make the transconductance of the circuit substantially independent of temperature through a gate overdrive voltage defined as a gate-source voltage minus a threshold voltage, the means for biasing comprising a current mirror coupled to the MOS transistor in the subcircuit;

a tuning circuit coupled to the current mirror, the tuning circuit comprising:

a MOS tuning transistor that carries the biasing current that the current mirror duplicates;

a bipolar transistor having an emitter connected to one of the supply terminals via a resistor, having a base connected to the reference-voltage generator and having a collector connected on to the other supply terminal via a series circuit having a diode and a resistor and to the gate of the MOS tuning transistor, which is connected between the other supply terminal and the current; and a reference-voltage generator coupled to the tuning circuit, wherein a gate overdrive voltage of the MOS tuning transistor having a gradient with temperature that is substantially equal and opposite to that of the mobility of the majority carriers in the channel of the MOS transistor in the subcircuit, said gate overdrive voltage of the MOS tuning transistor being obtained from the reference-voltage generator.

2. A transconductance circuit as claimed in claim 1, characterized in that the reference-voltage generator supplies to the tuning circuit a reference voltage having a gradient with temperature and a magnitude that cause the gradient with temperature of the gate overdrive voltage of the MOS tuning transistor to substantially compensate for that of the mobility of the majority carriers in the MOS transistor in the subcircuit.

3. A transconductance circuit as claimed claim 1, characterized in that the at least one MOS transistor comprises a differential pair of MOS transistors whose gates form inputs of the transconductance circuit and whose drains form its outputs.

4. A transconductance circuit as claimed in claim 3, characterized in that the differential pair of MOS transistors cooperate with a degeneracy resistor that is connected between the sources of the MOS transistors forming the pair.

5. A transconductance circuit as claimed in claim 4, characterized in that the degeneracy resistor is formed by a pair of MOS transistors that each have their gates connected to the gates of respective ones of the MOS transistors forming the differential pair.

6. A transconductance circuit as claimed in claim 1, characterized in that the transconductance subcircuit is connected between the two supply terminals via the biasing means on one side and a load circuit on the other.

7. An integrating circuit, characterized in that it comprises a transconductance circuit as claimed in claim 1, having an output connected to an integrating capacitor produced from the MOS transistor.

8. An oscillator, characterized in that it comprises a first and a second integrating circuit as claimed in claim 7, the first integrating circuit being coupled to the second integrating circuit in series, the second integrating circuit being coupled to an inverting amplifier and the inverting amplifier being coupled to an input of the first integrating circuit.

9. A delay circuit, characterized in that it comprises as least one integrating circuit as claimed in claim 3 coupled to a delay circuit.

* * * * *